United States Patent
Takabayashi

[19]

[11] Patent Number: 6,093,581
[45] Date of Patent: Jul. 25, 2000

[54] SOLAR CELL MODULE, PRODUCTION METHOD THEREOF, AND INSTALLATION METHOD OF SOLAR CELL MODULES

[75] Inventor: Akiharu Takabayashi, Nara, Japan

[73] Assignee: Canon Kabushiki Kaisha, Tokyo, Japan

[21] Appl. No.: 09/093,354

[22] Filed: Jun. 9, 1998

[30] Foreign Application Priority Data

Jun. 13, 1997 [JP] Japan ................................. 9-156220

[51] Int. Cl.[7] ............................................. H01L 21/00
[52] U.S. Cl. ........................... 438/64; 438/66; 136/251
[58] Field of Search .................. 438/64, 66; 136/251, 136/256, 259; 283/101

[56] References Cited

U.S. PATENT DOCUMENTS

| | | | |
|---|---|---|---|
| 3,957,537 | 5/1976 | Baskett et al. | 136/251 |
| 4,180,284 | 12/1979 | Ashley | 283/6 |
| 4,433,200 | 2/1984 | Jester et al. | 136/251 |
| 4,542,258 | 9/1985 | Francis et al. | 136/256 |
| 4,704,369 | 11/1987 | Nath et al. | 437/226 |
| 4,913,981 | 4/1990 | Hynes et al. | 429/1 |
| 5,342,872 | 8/1994 | Huber | 428/294 |
| 5,395,137 | 3/1995 | Kim | 283/81 |
| 5,480,494 | 1/1996 | Inoue | 136/251 |
| 5,582,433 | 12/1996 | Sisson | 283/81 |
| 5,759,291 | 6/1998 | Ichinose et al. | 136/256 |

FOREIGN PATENT DOCUMENTS

| | | | |
|---|---|---|---|
| 0 625 802 | 11/1994 | European Pat. Off. | |
| 4-32531 | 11/1992 | Japan | C08J 5/18 |
| 7-30139 | 1/1995 | Japan | H01L 31/042 |
| 8-114013 | 5/1996 | Japan | E04D 13/18 |
| 8-228018 | 9/1996 | Japan | H01L 31/042 |
| 8-306942 | 11/1996 | Japan | H01L 31/04 |

*Primary Examiner*—Mark Chapman
*Attorney, Agent, or Firm*—Fitzpatrick, Cella, Harper & Scinto

[57] ABSTRACT

In order to prevent damage to a surface of a solar cell module during production and in order to increase productivity, a colored, light-transmissive adhesive film is stuck on the light-receiving surface side of the solar cell module.

13 Claims, 7 Drawing Sheets

SOLAR CELL MODULE, PRODUCTION METHOD THEREOF, AND INSTALLATION METHOD OF SOLAR CELL MODULES

BACKGROUND OF THE INVENTION

1. Field of the Invention

The present invention relates to a solar cell module, a production method thereof, and an installation method of solar cell modules. More particularly, the invention concerns a solar cell module that has improved productivity and mountability and has little damage to the surface of solar cell module during production of the solar cell module or during installation of the solar cell module, a production method thereof, and an installation method of solar cell modules.

2. Related Background Art

There has been a global increase in the level of awareness of about environmental issues in recent years, and there is growing apprehension regarding the warming phenomenon of the earth due to $CO_2$ emission and desires for clean energy are becoming stronger and stronger. As a result of such environmental concerns, solar cells have received a lot of attention as a clean energy source.

There are various forms of the solar cells, and typical examples thereof are as follows.

(1) Single-crystal silicon solar cells
(2) Polycrystal silicon solar cells
(3) Amorphous silicon based solar cells
(4) Copper indium selenide solar cells
(5) Compound semiconductor solar cells These solar cells need to be coated with a coating material on the light incident side surface and on the bottom surface in order to protect the solar cells from mechanical stress and various environmental stresses such as temperature, humidity, and solar radiation. As the coating material on the light incidence side, normally glass, a transparent resin or the like is used. As the coating material on the bottom side, a resin, a metal, a composite thereof or the like is used.

In the conventional solar cell modules having the above-stated solar cells coated, in addition to the above coating materials, a transparent protective film as disclosed in Japanese Patent Application Laid-open No. 4-325531 or No. 8-306942 is stuck on the light incidence side in order to further protect the modules from external impact or chemical corrosion. In these examples, as shown in FIG. 1, a solar cell module 70 is constructed in the structure where crystal solar cell devices 75 are encapsulated by a bottom film 74, a transparent resin 73, and glass 72 and a protective sheet 71 is further stuck on the surface of glass 72. Japanese Patent Application Laid-open No. 7-30139 discloses that a detachable protective cover is attached to a solar cell module to protect the solar cell module and prevent an electric shock during installation.

In the past, there has not been, much awareness of problems arising when the solar cell modules underwent formation working of part in the manufacturing process thereof (i.e., in the state before completion). However, a new problem has been identified regarding how the solar cell surface should be protected during the formation working. A further new problem relates to how difficult it is to discriminate among different solar cell module different production lots or among different types of solar cell modules without additional cost under the condition where many solar cell modules were flowing in the process. Another problem relates to how difficult it was to install many modules of different types without damage to the solar cell modules and without confusion during installation of the solar cell modules.

SUMMARY OF THE INVENTION

An object of the present invention is to provide a production method and an installation method of solar cell modules having such structure that the surface thereof is unlikely to receive damage due to mechanical impact or the like in the production process, transport, and mounting of the solar cell modules. Another object of the present invention is to provide a production method wherein in production of solar cell modules, solar cell modules can be readily discriminated among different production lots or among different types, thereby improving production workability, and also to provide an installation method wherein in installation of solar cell modules, modules of different types or different strings can be readily discriminated from each other, thereby improving installation workability.

An object of the present invention is to provide a production method of solar cell module wherein a formation working step of a solar cell module is carried out after an adhesive film is stuck to at least a part of a light-receiving surface side and/or a non-light-receiving surface side of the solar cell module.

Another object of the present invention is to provide an installation method of solar cell modules for forming a part or the whole of a solar cell array by connecting a plurality of solar cell modules to each other in series, in parallel, or in series and parallel in every block, the method comprising a step of installing solar cell modules wherein adhesive films of different colors among respective blocks are stuck on a part or the whole of a light-receiving surface side and then a step of removing the adhesive films.

An additional object of the present invention is to provide a solar cell module having an outermost surface of a peelable, colored, light-transmissive, protective member.

In the production method according to the present invention, it is preferable to further employ either one of the following:

the adhesive film is stuck to an area except for an area undergoing the formation working;

the adhesive film is stuck to the light-receiving surface side;

the adhesive film is a transparent/translucent film;

inspection of electric output is carried out by exposing the solar cell module to light while the adhesive film is kept stuck thereon;

among different production lots of solar cell modules, colors of the adhesive films are different from each other;

a color of the adhesive film corresponds to a sheet for record of management information of each production lot of solar cell module, for example, the color of the adhesive film is the same as a color of the sheet;

the formation working is a roll former working;

a solar cell device of the solar cell module is an amorphous silicon based solar cell device formed on a stainless steel substrate;

the light-receiving surface side of the solar cell module is made of a transparent weatherproof resin and the solar cell module has a formable reinforcing plate on the non-light-receiving surface side, and so on.

In the installation method according to the present invention, it is preferable to further employ either one of the following:

the plurality of solar cell modules are divided in blocks according to their types;

the adhesive films are stuck in production of the solar cell modules;

the adhesive films are transparent/translucent films;

after installation of the solar cell modules, inspection of electric output of the solar cell modules is carried out while the adhesive films is kept stuck thereon;

solar cell devices used in the solar cell modules are amorphous silicon based solar cell devices formed on a stainless steel substrate;

the light-receiving surface side of the solar cell modules is made of a transparent weatherproof resin and the solar cell modules have a formable reinforcing plate on the non-light-receiving surface side.

According to the production method of solar cell module of the present invention, at least a part of the solar cell module is subjected to the formation working during the production process thereof. At this time, damage or the like to the module surface due to the working can be prevented by sticking the adhesive film to a part or the whole of the solar cell module. When the formation working is a roll former working, the working can be furthermore improved by sticking the adhesive film to only a part of the light-receiving surface side, a part of the non-light-receiving surface side, or each part of the both side of the solar cell module and thereafter carrying out the formation working of the area where the adhesive film is not stuck, taking account of variation in the finished size after the working, peeling of the adhesive film, and so on when the adhesive film is stuck on the whole surface of solar cell module. Damage can be prevented to the surface of solar cell module not only during the production process, but also in packaging, shipping, and transportation, by keeping the adhesive film as stuck on the solar cell module during the above formation working and also during the inspection and packaging thereafter.

Since the adhesive film is very thin, different from the conventional protective covers, observation of the solar cell module surface can be performed while the adhesive film is kept stuck, so that visual inspection can also be performed while the adhesive film is kept stuck.

When the adhesive film stuck to the light-receiving surface side is transparent/translucent, the inspection of electric output can be performed while the solar cell module is exposed to light while the adhesive film is kept stuck.

When the adhesive films are color-coded, workability can be increased during the production process and hence the working efficiency can be increased. Specifically, discrimination becomes easier among different production lots by assigning different colors to the adhesive films among the production lots (among types, among production conditions, and so on). Particularly, as to the types, the effect is prominent among solar cell modules of different types having the same outside dimensions and thus being hard to discriminate by appearance.

Further, efficiency can also be increased in the management aspect by using, as a color of the adhesive film, the same color as a color of a sheet for record of management information (information about production conditions, inspection result, quantity management, and so on) of each production lot of solar cell modules.

On the other hand, according to the installation method of solar cell modules of the present invention, the adhesive films of different colors for the respective blocks, specifically for the types or strings of the solar cell modules, are stuck to the solar cell modules, which permits us to obviously recognize the different types or strings, which facilitates installation upon construction, which will do for prevention of installation error, and which also remarkably improves the installation workability.

Since the adhesive films are removed after installation of the solar cell modules, the modules have no loss due to absorption of light by the adhesive films during use. When the adhesive films are preliminarily stuck in the production of solar cell modules, the operational effect as described previously can also be expected during the production of solar cell modules. When the adhesive films are transparent/translucent, some output can be obtained in a state of incidence of the sunlight, and thus the inspection of electric output can be performed while the solar cell module is being installed.

DETAILED DESCRIPTION OF THE PREFERRED EMBODIMENTS

Figure 1:
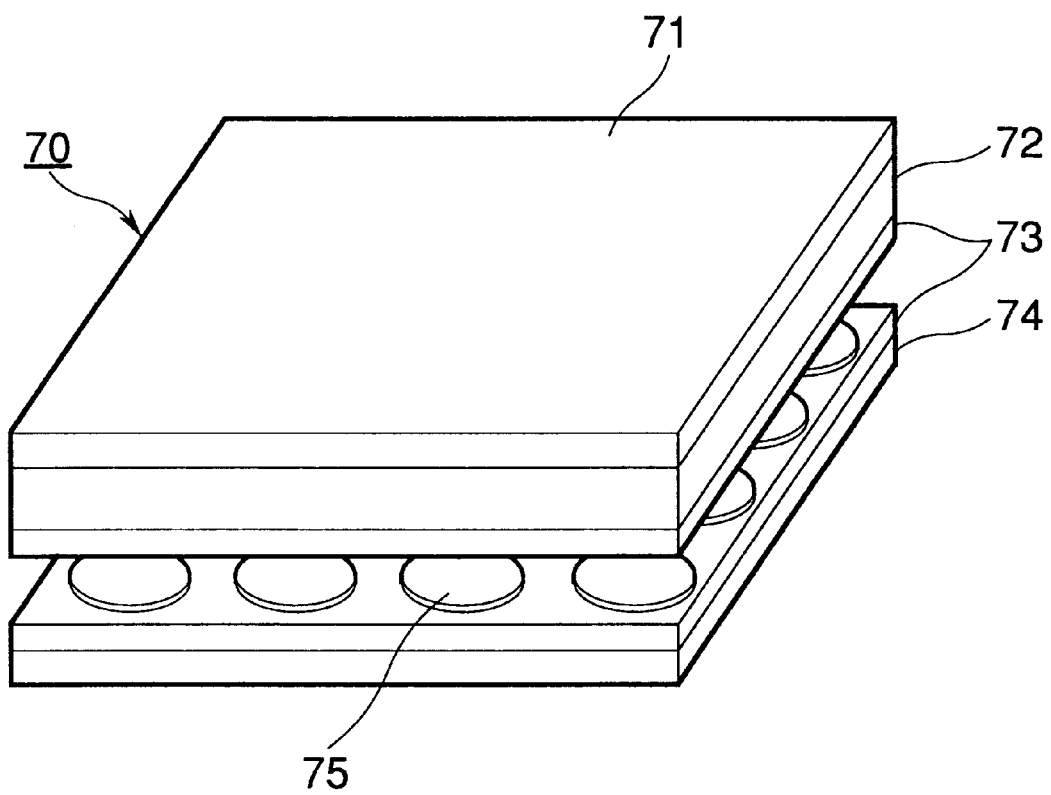
FIG. 1 is a schematic, perspective assembly drawing for explaining an example of the solar cell module.

The solar cell module of the present invention has a film for protection on the surface on the light incidence surface side of the solar cell module. This film is provided for protection of the light incidence surface side of the solar cell module from damage, pollution, etc. in the production and installation processes, rather than for protection of the solar cell module from the external factors after installation of the solar cell module.

The present invention will be described in detail, referring to the drawings with necessity. It is noted that the present invention is by no means limited to the following description and the drawings, but various modifications and combinations can be suitably employed within the scope and spirit of the present invention.

FIGS. 2A to 2C and FIGS. 3A to 3C illustrate examples of production steps for producing roof-integrated solar cell modules of type (I) and type (II), respectively. The types (I) and (II) are the same except that positions of terminals of the solar cell module are reversed left to right. Specifically, the solar cell module 10 of the type (I) of FIGS. 2A to 2C has a plus terminal 11 at the right end and a minus terminal 12 at the left end; the solar cell module 20 of the type (II) of FIGS. 3A to 3C has a plus terminal 21 at the left end and a minus terminal 22 at the right end.

Figure 2A:
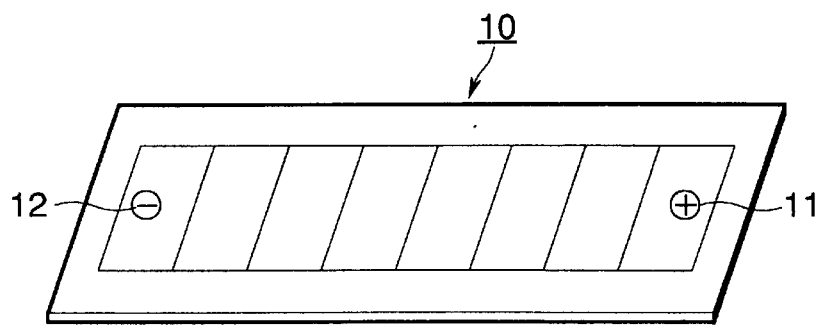
FIGS. 2A, 2B, 2C and 2D are schematic, perspective views for explaining an example of the production method of solar cell module according to the present invention.
Figure 2B:
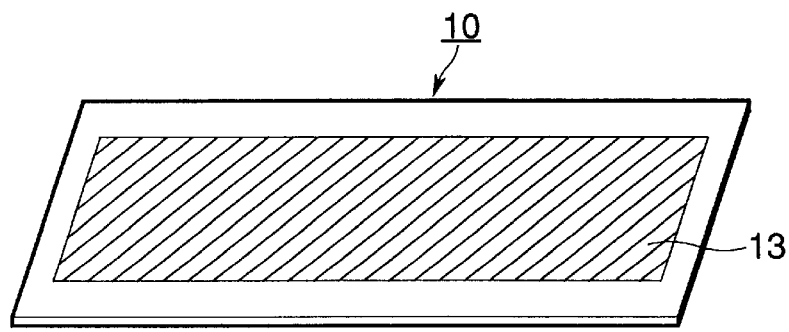
Figure 3A:
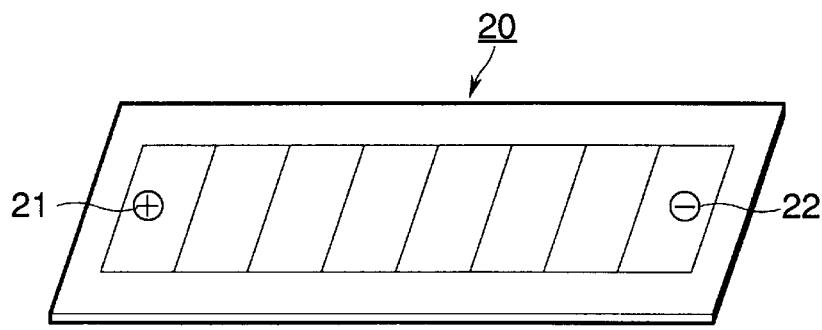
FIGS. 3A, 3B, 3C and 3D are schematic, perspective views for explaining another example of the production method of solar cell module according to the present invention.
Figure 3B:
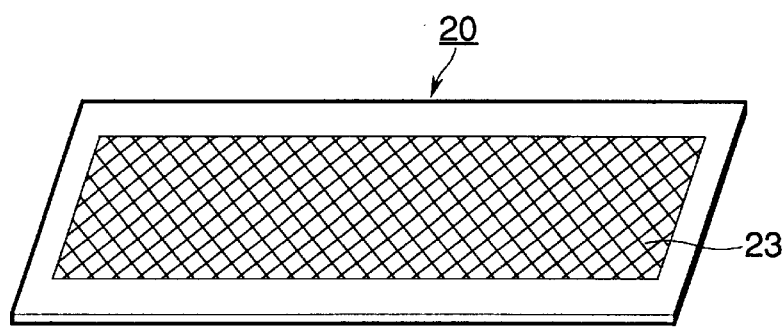

The solar cell modules 10 and 20 of a flat plate state are completed up to step (A) (FIG. 2A and FIG. 3A).

In step (B) (FIG. 2B and FIG. 3B), adhesive films 13 and 23 are stuck each to a surface of the light-receiving surface side of the solar cell modules 10 and 20, respectively. At this time, the adhesive films (peelable (removable) adhesive films) 13 and 23 are preferably of different colors; for example, the color of the adhesive film 13 is blue while the color of the adhesive film 23 is red, so as to facilitate discrimination of the types (I) and (II) from each other. The adhesive films 13 and 23 are, preferably, not stuck on portions for undergoing formation working in a subsequent step.

In step (C) (FIG. 2C and FIG. 3C), the solar cell modules 10 and 20 are subjected to the formation working, thereby forming ridge side engaging portions 14 and 24 and eaves side engaging portions 15 and 25. At this time, these formed portions desirably lie outside the portion where the adhesive film 13 or 23 is stuck. The formation working also includes the other formation than the formation of the above-discussed portions, and the formation working further includes cases of working into a desired shape by working except for bending.

In step (D) (FIG. 2D and FIG. 3D), illustrated is an example where the solar cell modules 10 and 20 having the adhesive films 13 and 23 stuck thereon, respectively, are exposed to light using a light source 16 and 26 and their electric output is inspected in that state. Step (D) does not always have to be carried out in terms of the production steps of the solar cell module.

The above production method was described with the examples of the roof-integrated solar cell modules, but the present invention is not limited to the examples, and can also be applied to the solar cell modules of a stand installation type, a ground installation type, and so on. The above embodiment showed the example where the types were different, but the invention may also be applied to the cases where production lots are different, for example depending upon the difference in the production conditions.

Figure 2C:
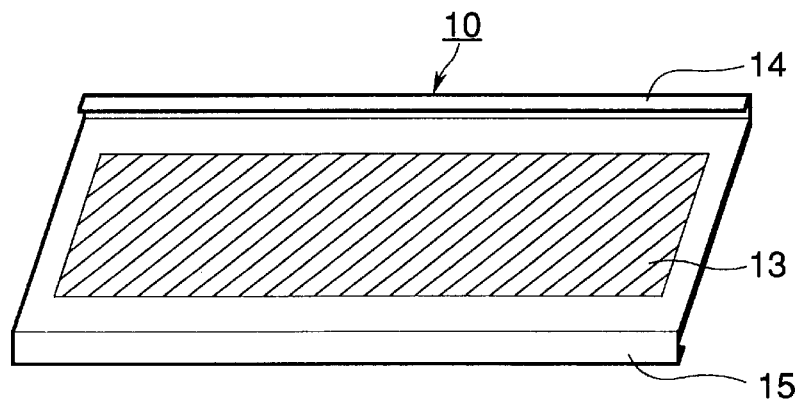
Figure 2D:
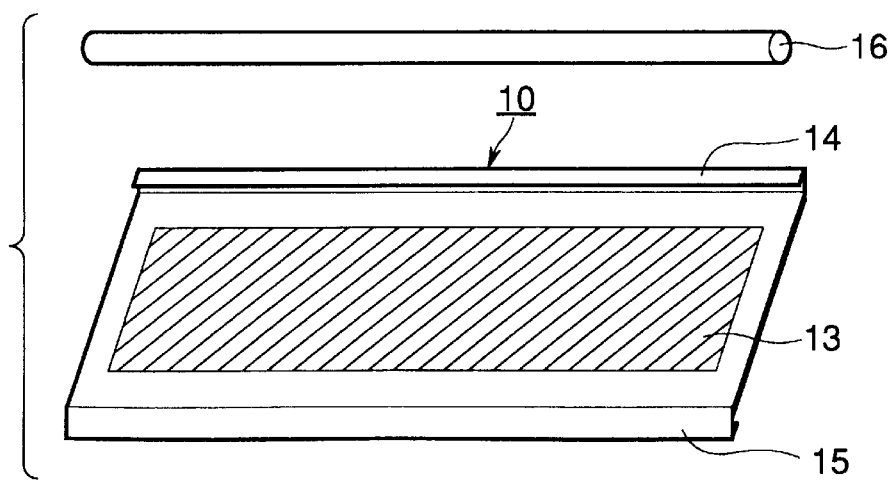
Figure 4A:
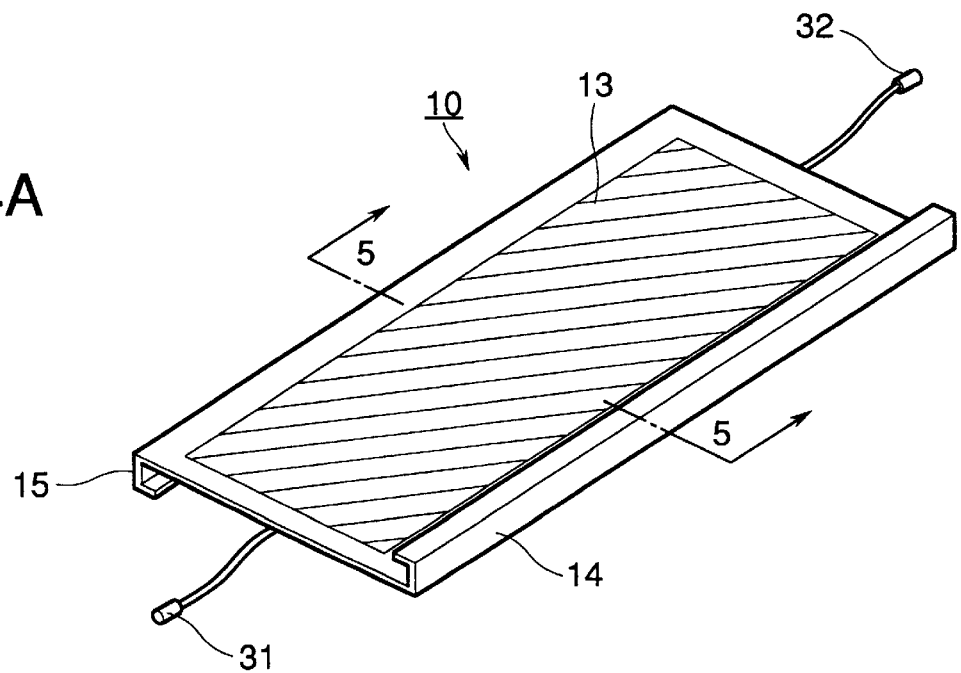
FIGS. 4A and 4B are schematic, perspective views for explaining an example of the solar cell module according to the present invention.
Figure 4B:
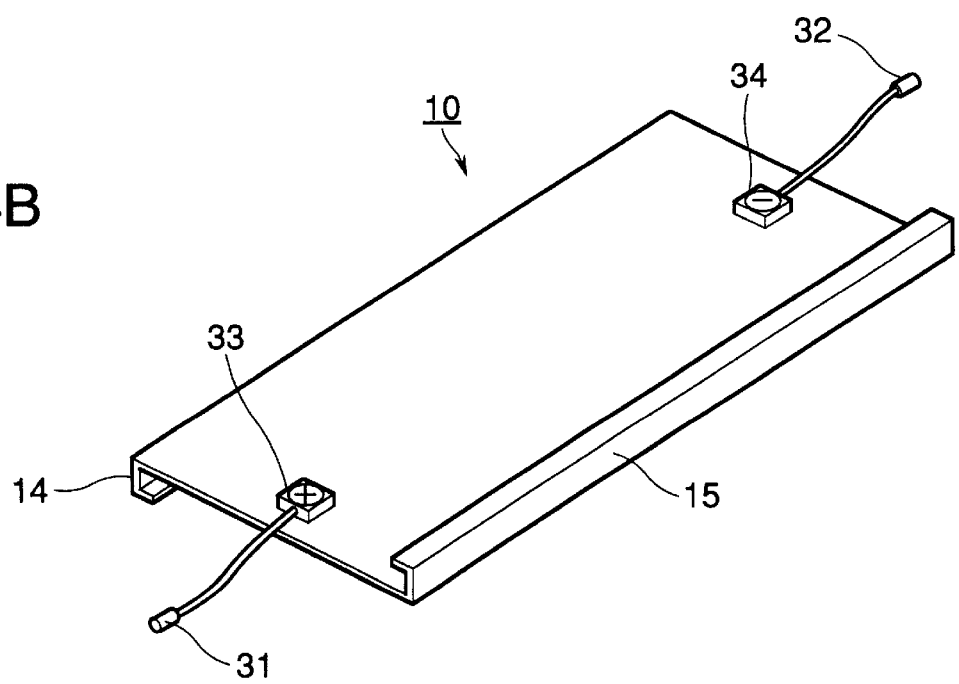

FIG. 4A is a schematic, perspective view for showing the surface of the roof-integrated solar cell module 10 shown in FIG. 2C, that is, a perspective view in the reverse relation of the near and far sides from FIG. 2C, and FIG. 4B is a schematic, perspective view of the bottom surface thereof. Since the solar cell module 10 is of the roof-integrated type, it has the ridge side engaging portion 14 and eaves side engaging portion 15, similar to the ordinary roof materials, and it further has a positive coupling connector 31 and a negative coupling connector 32 as a solar cell module. As shown in FIG. 4B, each of coupling connectors 31 and 32 is electrically connected through a terminal box 33 or 34 to the solar cell device.

Figure 5:
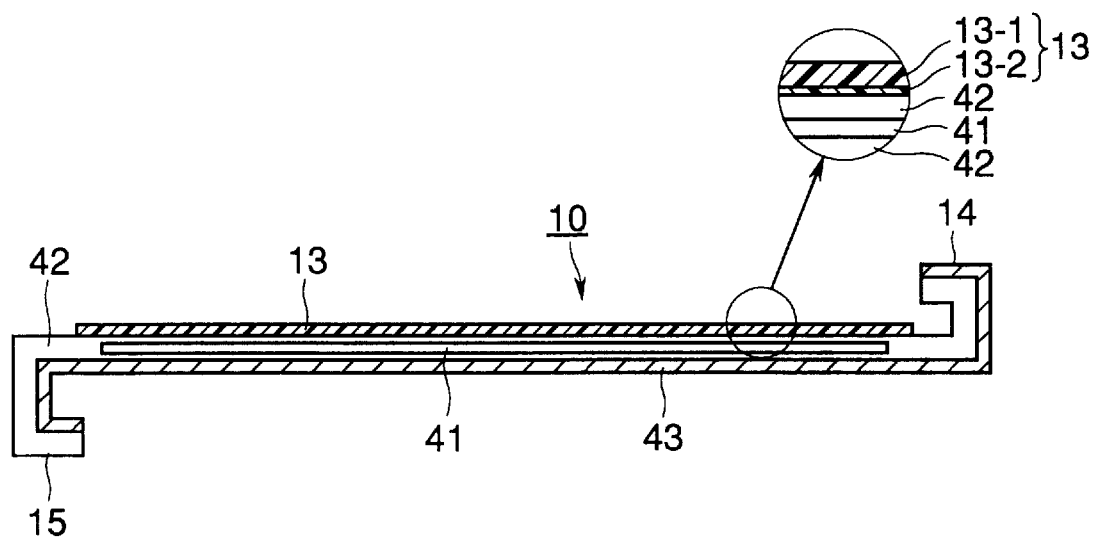
FIG. 5 is a schematic, cross-sectional view for showing the solar cell module taken in the line 5—5 of FIG. 4A.

FIG. 5 is a schematic, cross-sectional view taken in the line 5—5 in FIG. 4A for explaining the solar cell module in further detail. In FIG. 5, the solar cell module 10 is constructed in such structure that the solar cell device 41 is encapsulated by weatherproof resin 42 and that a back reinforcing plate (support) 43 capable of undergoing formation working is integrated on the bottom surface. As illustrated in the partially enlarged view in FIG. 5, the adhesive film 13 may have a layer 13-2 of a glue or adhesive on one surface of a film 13-1.

Figure 6:
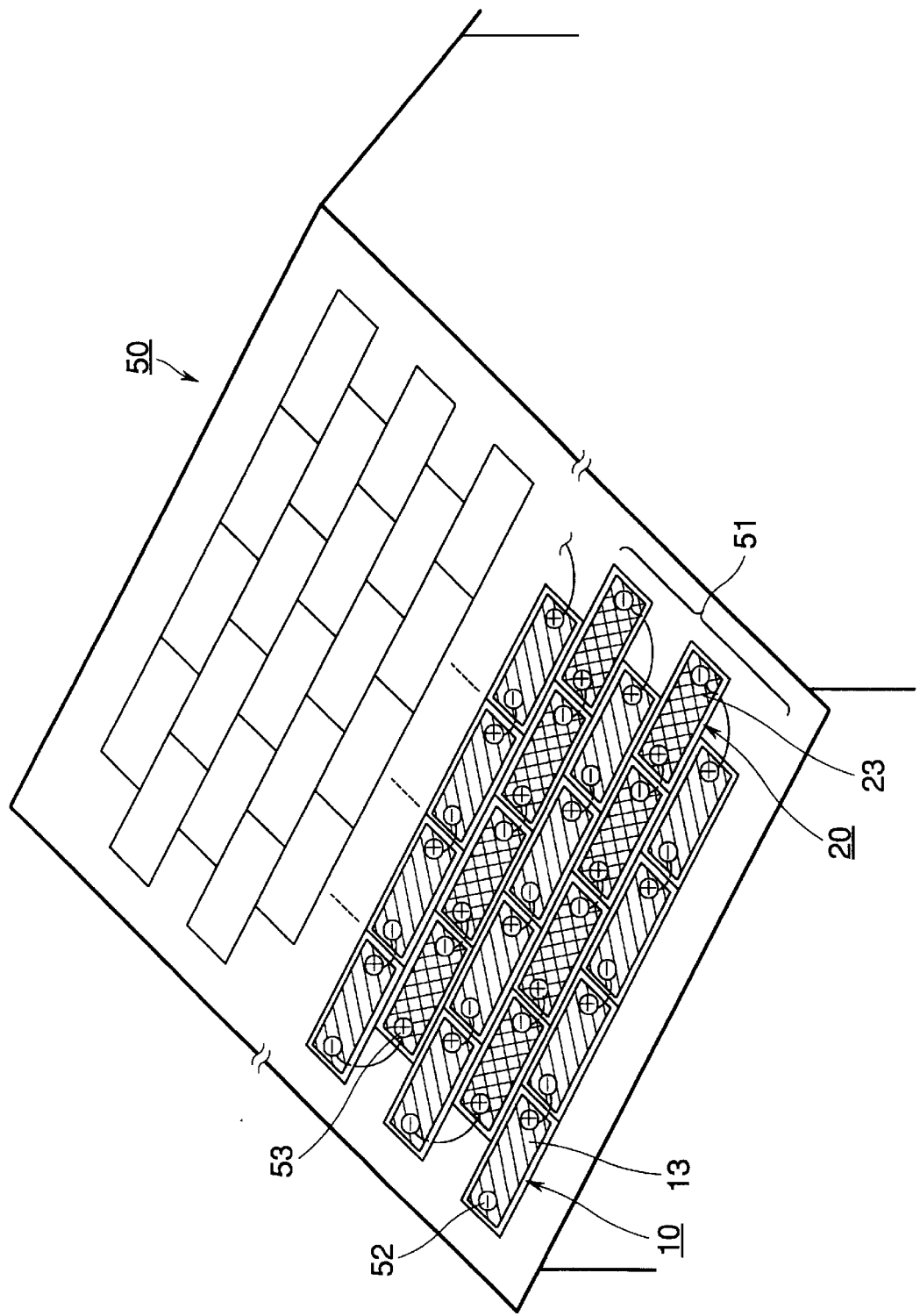
FIG. 6 is a schematic, perspective view for explaining an example of the installation method of solar cell modules according to the present invention.

FIG. 6 shows an example of the installation method of the roof-integrated solar cell modules according to the present invention. This example will be described below in detail.

Figure 3C:
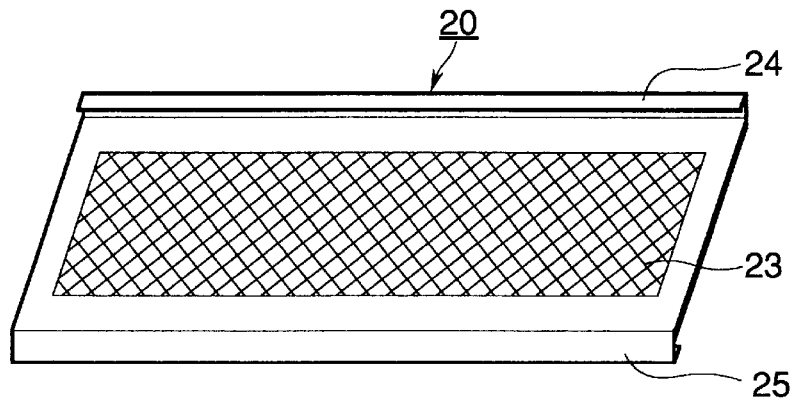
Figure 3D:
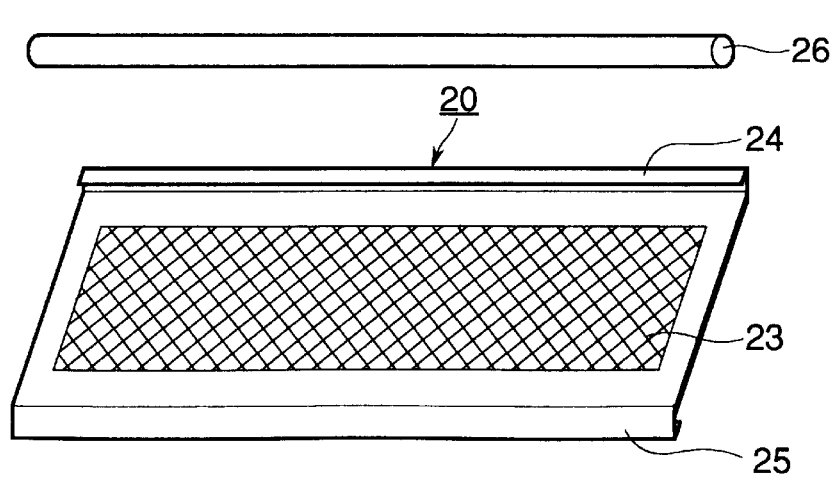

FIG. 6 shows the example in which a solar cell array obtained by wiring the roof-integrated solar cell modules 10 and 20 as shown in FIG. 2C and FIG. 3C is installed on a gable roof 50.

In the present example, the sixteen solar cell modules are sequentially connected in series using the coupling connectors 31 and 32 of the respective modules (see FIG. 4A and FIG. 4B), thereby constructing one string. Each string 51 has a negative terminal 52 and a positive terminal 53. In this case, the solar cell modules 10 (see FIG. 2C) are located in the odd lines from the bottom while the solar cell modules 20 (see FIG. 3C) in the even lines, thereby minimizing lengths of cables for coupling.

The installation method of the roof-integrated solar cell modules according to the present example will be described below in detail.

(1) Prior to the installation, 48 modules of the same type as the solar cell module 10 (FIG. 2C) and 48 modules of the same type as the solar cell module 20 (FIG. 3C) are prepared. A blue adhesive film is stuck to the solar cell module 10 and a red adhesive film is stuck to the solar cell module 20 in order to facilitate identification of the respective types as described previously.

(2) Sixteen solar cell modules to compose one string are installed from the bottom while the adhesive films are kept stuck on the module. The negative terminal of the leftmost solar cell module 10 in the first line becomes the negative terminal 52 of the first string. The solar cell modules 10 are placed in the odd lines and the solar cell modules 20 in the even lines. Wires between the respective modules are connected through the coupling connectors 31 and 32 (FIG. 4A or FIG. 4B) while placing the modules. In this way, the modules 10 having the blue adhesive film 13 stuck thereon are placed in the odd lines while the modules 20 having the red adhesive film 23 stuck thereon are placed in the even lines.

(3) When the totally sixteen of the solar cell modules 10 and 20 are connected in series, the first string is completed and at the string end the coupling connector is not connected to the next solar cell module and is used as a positive terminal 53 of the string.

(4) The second string to sixth string are formed in the same manner as in the first string.

(5) After completion of installation, the electric output is inspected under the sunlight before removal of the adhesive films 13 and 23.

(6) After completion of the inspection, the adhesive films of the all solar cell modules are removed.

(7) Cables for leading the power to the inside of house are connected to the negative terminals 52 and positive terminals 53.

Each of the constituent elements in the production method and the installation method of the solar cell modules according to the present invention will be described below in detail.

(Formation working)

The formation working in the present invention can be carried out by using the methods and apparatus generally used for such material as steel sheets; for example, roll former working, bender working, press working, and so on.

(Solar cell modules)

There is no specific limitation on the solar cell devices used in the solar cell modules in the present invention, but they may be, for example, the single-crystal silicon solar cells, the compound semiconductor solar cells of GaAs, CdS, InP, CdTe, CuInSe or the like, the solar cells using the non-single-crystal semiconductors such as the polycrystal silicon solar cells or amorphous silicon based solar cells of amorphous Si, amorphous SiGe, or amorphous SiC, and so on.

On the other hand, a more preferred configuration of the solar cell module in the present invention is a solar cell module having flexibility, particularly a preferable solar cell module using amorphous silicon based solar cell devices formed on a stainless steel substrate. Namely, the amorphous silicon based solar cell devices formed on the stainless steel substrate can be as thin as about 0.1 mm, and thus can decrease an amount of a filler used for coating the solar cell devices or for encapsulating the periphery thereof. Since the amorphous silicon based semiconductors generally have flexibility, the solar cells are more unlikely to break even upon the formation working. Use of the non-single-crystal semiconductors typified by the amorphous silicon based semiconductors formed on the stainless steel substrate can decrease the weight of the solar cell devices, and as a result, the thickness of the back reinforcing plate detailed hereinafter can be decreased. Therefore, the material cost can be reduced.

(Adhesive films)

The adhesive films used in the present invention may be any adhesive films that are peelable after they are stuck to the solar cell modules, for example, a surface protective sheet No. 947 available from Teraoka Seisakusho K. K., or the like. The adhesive films may be colorless and transparent, but colored adhesive films are preferred. For example, the colors may be selected from red, orange, yellow, green, blue, black, white, and so on. More preferably, the adhesive films are so transparent or translucent as to transmit the light. Further, more preferred adhesive films are of a material leaving no adhesive on the surface of solar cell module when the adhesive film is peeled.

The films that can be used are almost all materials having the protection performance. Examples of such materials are polyethylene based resin, polyester based resin, polyether sulfone based resin, polyamide based resin, polyimide based resin, polycarbonate based resin, polyolefin based resin, acrylic resin, acetate based resin, and so on. More specifically, the films can be suitably selected from the known synthetic resin films such as polyethylene film, polypropylene film, polyester film, cellulose triacetate film, polycarbonate film, polyamide film, and so on.

In order to further enhance the protection performance of surface, a protective material such as paper may be further provided on the top surface side of the film, i.e., on the other surface than the surface facing the solar cell. Of course, paper can also be used as the film for the purpose of protection.

The glue (or adhesive) used for gluing the adhesive film to the solar cell module is one set so that the gluing strength (adhesive strength) to the above-discussed film for protection is higher than the gluing strength (adhesive strength) to the surface of solar cell module, i.e., to a filler or a permanent protective film such as a fluorine-containing film (fluororesin film or the like) provided on the filler layer.

In the case where after the adhesive film is peeled, it still has sufficient gluing capability or adhering capability, care is needed for handling of the adhesive film after peeled. Therefore, it is preferable to use such a glue or adhesive as to lower the gluing capability or adhering capability to a level posing no substantial problem after peeled. Specifically, pressure-sensitive adhesives are used suitably. It is, however, also allowed to use materials that decrease the gluing capability or adhering capability of the surface on such a basis that the surface of the glue or adhesive after peeled adsorbs water, oxygen, etc. in the air or reacts therewith.

Examples of the pressure-sensitive adhesives are adhesives of a natural rubber type, a synthetic rubber type, an acrylic type, or a vinyl acetate type.

Examples of the above pressure-sensitive adhesives of the rubber type or the acrylic type are obtained by using as a base polymer, a rubber based polymer such as natural rubber or various synthetic rubbers, or an acrylic polymer such as polyalkyl(meth)acrylate, or a copolymer of alkyl(meth) acrylate and another unsaturated monomer copolymerizable therewith, and if necessary, by blending the base polymer with a crosslinking agent such as a polyisocyanate compound or an alkyl-etherified melamine compound.

The thickness of the adhesive layer is suitably adjustable, and preferably about 1 to 500 $\mu$m. It is, however, noted that the invention is not limited to this range.

Coloring can be effected by adding a pigment or a dye to the film itself. Alternatively, the coloring can be conducted for the glue or adhesive, but not for the film itself.

It is apparent that the coloring can be conducted throughout the entire surface of the film or the like or only in part thereof. For the electric test after installation, the coloring is preferably effected so that the area except for the light-receiving area is colored or so that the coloring density is as low as possible within a distinguishable range.

It is noted that the layer of the glue or adhesive does not always have to be provided. It is sufficient for the film itself to have the gluing or adhering capability and to be peelable. Alternatively, adhesion by static electricity is also effective, depending upon applications thereof.

(Production lots)

The production lots of solar cell modules in the present invention are units of quantity management in production steps, management of production conditions, or management of types, and, if the production lots have a hierarchy, they may be any of the lowest lot, the highest lot, and middle lots between them.

(Production conditions)

The production conditions of the solar cell modules in the present invention include operation conditions of a production apparatus for producing the solar cell modules, process conditions of each production step, and so on.

(Types)

The types of the solar cell modules in the present invention include symbols for identifying models, difference in polarity, design change, and so on. The design change stated above may include the case where the solar cell module itself is not altered but the adhesive film stuck to the module is different.

(Management information)

The management information in the present invention includes informations such as production management, product management, etc.; specifically, informations about production conditions, inspection results, quantity management, and so on.

(Inspection results)

The inspection results of the solar cell modules in the present invention include inspection results of output voltage, output current, output power, electric characteristics of bypass diode and blocking diode, appearance, dimensions, etc., which are carried out in the production process of the module.

(Quantity management)

The quantity management of the solar cell modules in the present invention includes managing quantities put into steps in the production process, quantities eliminated as defectives, or quantities fed to next steps as non-defectives.

(Transparent weatherproof resin)

There is no specific limitation on the transparent weatherproof resin for making the light-receiving surface side of the solar cell module in the present invention, but it may be, for example, one composed of a transparent weatherproof film, a filler, and a glass fiber. The transparent weatherproof film preferably has the elongation percentage of not less than 250% in directions of elongation of the film by the formation working. There is no specific limitation on a kind of the transparent weatherproof film, but a fluororesin film is preferably applicable, taking the weatherproof property, mechanical strength, and transparency into consideration. A more preferred film is a copolymer film of non-oriented ethylene-tetrafluoroethylene. The filler is, for example, ethylene-vinyl acetate copolymer (EVA), polyvinyl butyral, silicone resin, or the like, but it is not limited to these examples.

(Back reinforcing plate)

There is no specific limitation on the back reinforcing plate of the solar cell modules in the present invention, and it may be any material that can reinforce the strength of the solar cell modules and that can undergo the formation working. Specifically, the back reinforcing plate can be selected from a rustproof steel sheet such as a hot-dip zinc-coated steel sheet or a galvanized steel sheet, a sheet of special steels and nonferrous metals, a stainless steel sheet, a weatherproof steel sheet, a copper sheet, an aluminum alloy sheet, a lead sheet, a zinc sheet, a titanium sheet, and so on.

The present invention will be described in further detail with examples, but it should be noted that the present invention is not intended to be limited to these examples.

EXAMPLE 1

The present example is an example wherein the solar cell modules using the amorphous silicon solar cell devices produced on the stainless steel substrate undergo the formation working into the roof-integrated modules and 96 solar cell modules thus obtained are installed on a gable roof.

First described are procedures for fabricating the amorphous silicon solar cell devices (not shown in the drawings).

On a stainless steel substrate cleaned, an Al layer (the thickness 5000 Å) and a ZnO layer (the thickness 5000 Å) were successively formed as a back reflective layer by utilizing the sputter method. Then, by utilizing the plasma CVD method, n-type amorphous Si layers were formed from mixed gas of $SiH_4$, $PH_3$ and $H_2$, i-type amorphous Si layers were formed from mixed gas of $SiH_4$ and $H_2$, and p-type microcrystal amoruphous Si layers from mixed gas of $SiH_4$, $BF_3$, and $H_2$, thereby forming a tandem type amorphous Si solar cell device in the layer structure of n-type layer of thickness 150 Å/i-type layer of thickness 4000 Å/p-type layer of thickness 100 Å/n-type layer of thickness 100 Å/i-type layer of thickness 800 Å/p-type layer of thickness 100 Å. Then a thin film of $In_2O_3$ (the thickness 700 Å) as a transparent electroconductive layer was formed by evaporating In under an $O_2$ atmosphere by utilizing the resistance heating method. Further, a grid electrode for collection of electricity was formed by screen printing of silver paste, and finally a copper tab, used as a minus output terminal, was attached to the stainless steel substrate by spot welding while a tape of tin foil, used as a plus output terminal, was attached to the collector electrode by soldering, so as to form the output terminals, thus obtaining the solar cell devices.

Figure 7A:
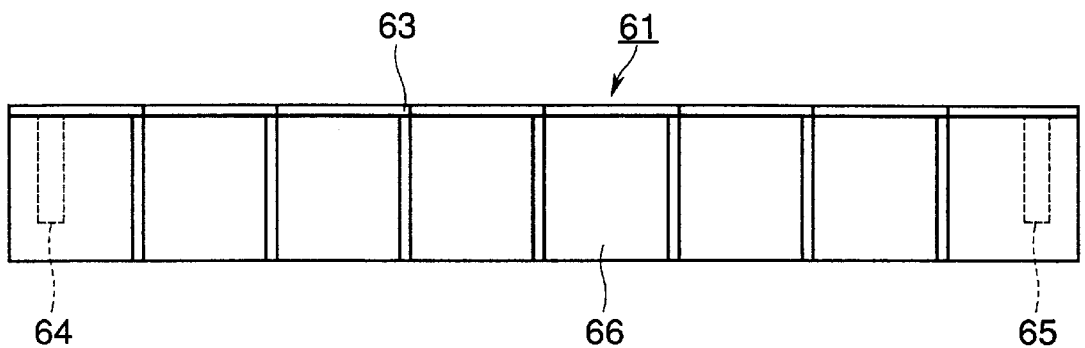
FIGS. 7A and 7B are schematic, plan views each for explaining an example of a solar cell device block.

The next method to be described, referring to FIG. 7A, is a method for producing a solar cell device block by connecting the above solar cell devices in series. Eight solar cell devices 66 were arranged as illustrated and thereafter the plus terminal of a left device and the minus terminal of a right device out of two adjacent devices were connected in each series connecting part 63 by soldering in order. Further, a negative terminal 64 was formed in the back surface at the left end of the solar cell device block and a positive terminal 65 in the back surface at the right end. These terminals are used as the positive and negative terminals of the solar cell module. Prepared by this process were forty eight solar cell device blocks 61 each comprising eight solar cell devices 66 connected in series.

Figure 7B:
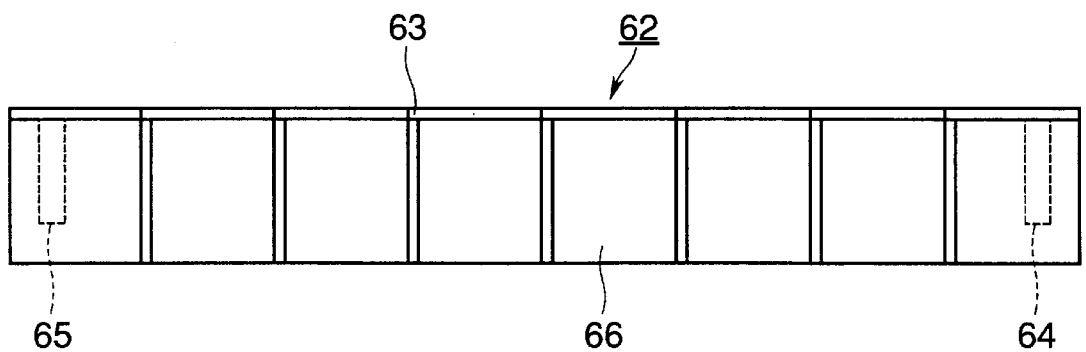

FIG. 7B shows a solar cell device block 62 having reversed polarities from those of the above solar cell device block 61. The preparation procedures were the same as those for the solar cell device block 61 except that the positive/negative connection method was reversed. In the solar cell device block 62 obtained, a positive terminal 65 was formed in the back surface at the left end while a negative terminal 64 in the back surface at the right end, and these terminals are used as the positive and negative terminals of the solar cell module. Forty eight solar cell device blocks 62 were prepared herein.

In the production of the ninety six total solar cell device blocks, lot management slips were prepared; blue slips were attached to the device blocks 61 and red slips to the device blocks 62. Thereafter, these slips were made to run through the production process with the respective modules until the solar cell modules were completed.

In the present example the above-described device blocks 61 and 62 were very alike and it was difficult to discriminate them by appearance; however, it was confirmed that use of the management slips of the different colors for the respective device blocks made discrimination very easy in the production process and remarkably improved the work efficiency.

Next described are procedures for producing the solar cell modules by coating the above solar cell device blocks with resin (not shown in the drawings). First, coating materials and a solar cell device block were stacked in the following order.

Surface resin film/light-receiving surface side transparent organic polymer resin/fiber inorganic compound (40 g/m$^2$)/ solar cell device block/fiber inorganic compound (20 g/m$^2$)/ back integral laminate film/back reinforcing plate.

Each of the coating materials will be described in detail.
<Surface resin film>

A non-oriented ethylene-tetrafluoroethylene film (ETFE) of 50 μm thick was prepared as a surface resin film. A surface thereof in contact with the filler preliminarily underwent the plasma process.

<Light-receiving surface side transparent organic polymer resin>

An EVA sheet of 460 μm thick was prepared as a filler by mixing and formulating an ethylene-vinyl acetate copolymer (vinyl acetate 25 wt %), a crosslinking agent, an ultraviolet absorber, an antioxidant, and a light stabilizer.

<Fiber inorganic compounds>

•Fiber inorganic compound (40 g/m$^2$)

Prepared was a glass non-woven fabric having the basic weight of 40 g/m$^2$, the thickness of 200 μm, and the fiber diameter of 10 μm and containing 4.0% acrylic resin as a binder.

•Fiber inorganic compound (20 g/m$^2$)

Prepared was a glass non-woven fabric having the basic weight of 20 g/m$^2$, the thickness of 100 μm, and the fiber diameter of 10 μm and containing 4.0% acrylic resin as a binder.

<Back integral laminate film>

Prepared as an integral laminate film was one having the total thickness 500 μm in the integral laminate structure wherein layers of ethylene-ethyl acrylate copolymer (EEA) (the thickness 200 µm) and polyethylene (PE) resin (the thickness 25 µm) as adhesive layers, and a biaxially oriented polyethylene terephthalate film (PET) (the thickness 50 µm) as an insulating film were integrally laminated in the order of EEA, PE, PET, PE, and EEA.

<Back reinforcing plate>

Prepared as a back reinforcing plate was a steel sheet obtained by coating one surface of a galvanized steel sheet (a steel sheet coated with an aluminum-zinc alloy of aluminum 55%, zinc 43.4%, and silicon 1.6%) with a polyester based paint and coating the other surface with a polyester based paint containing glass fibers. The steel sheet had the thickness of 400 µm.

The aforementioned stacked members were heated in vacuum using a laminate apparatus of a single vacuum method, thereby fabricating flat solar cell modules. Vacuum conditions on that occasion were the evacuation rate 76 Torr/sec and evacuation in the vacuum of 5 Torr was conducted for 30 minutes. After that, the laminate apparatus was put into a hot air oven of 160° C. to be heated for 50 minutes. On this occasion, the EVA was kept under the circumstance of 140° C. or more for 15 minutes or more, thereby melting and crosslinking the EVA.

Then a transparent blue adhesive film was stuck to each module produced from the solar cell device block 61 and a transparent red adhesive film was stuck to each module produced from the block 62, in a portion that would not undergo the formation working on the light-receiving surface side. The adhesive films were films of 0.07 mm thick obtained by using polyethylene as a support and acrylic resin as a glue. The gluing strength was 2.94 N/25 mm.

Then the modules were processed into the shape as shown in FIG. 4A (or FIG. 4B) by a roll former working. At this time the working was carried out while the roller was prevented from touching the portion of solar cell device and the portion on which the adhesive film was stuck. After the formation working, the inspection of open-circuit voltage was conducted while the solar cell modules were exposed to light from a fluorescent lamp of the illuminance of 200 lux while the adhesive films were kept stuck thereon. All of the 96 sheets of modules processed yielded the output of 0.4 V or more and satisfied the acceptance criterion. Finally, inspection of appearance was carried out by visual observation and it was confirmed that no flaw existed. Then the solar cell modules completed were packed in a corrugated cardboard box while the adhesive films were kept stuck thereon. The solar cell modules thus packed were transported on a truck to an installation site.

Described below are installation procedures at the installation site.

The 96 sheets of solar cell modules were installed on the gable roof shown in FIG. 6. As illustrated, the solar cell modules were installed in the array of four in each horizontal line and totally 24 lines. The number of series modules per string was 16 and six strings were connected in parallel.

The installation of the solar cell modules was started from the first line, which was the lowermost row, while the adhesive films were kept stuck thereon. Used in the first line were the solar cell modules 10 having the blue adhesive film thereon and the positive terminal located at the right end of each solar cell module. The left end of the leftmost module in the first line was the negative terminal of the first string and coupling cables of the respective modules were coupled in order up to 16 series. Used in the second line were the solar cell modules 20 having the red adhesive film thereon and the positive terminal located at the left end of each module; similarly in this way, the modules 10 were used for the odd lines and the modules 20 for the even lines.

When the sixteenth series module of the first string was installed, the coupling cable of this module was not connected to the next module and was left as a positive terminal of the first string.

After that, the second string to the sixth string were installed in the same manner. On the occasion of installation, the work efficiency was very high without placing any module of an unexpected type, because of the color-coding between the solar cell modules 10 and 20. Since the installation was carried out in order from the bottom line to the top line, the work was done while the workers stood on the modules already installed.

After completion of the installation, the open-circuit voltage of each string was measured under irradiation of the sunlight before removal of the adhesive films. At the same time as it, reference solar cell modules of the two types having the adhesive films (not shown in the drawings), which had been confirmed to be good products, were separately prepared and preliminarily placed on the same roof surface, and open-circuit voltages thereof were measured. A measured value of the open-circuit voltage of each string was compared with the value of (the sum of measured voltages of the reference solar cell modules of the two types)×8, and the six strings showed differences therefrom only within ±5%. It was thus determined that the differences were not significant.

After completion of the inspection, all of the films were removed with care. It was confirmed that no large flaw existed in appearance, though the workers installed the solar cell modules while standing thereon.

EXAMPLE 2

The present example is an example of installation of an array wherein 15 series single-crystal silicon solar cell modules are placed per string and totally four strings are connected in parallel. In the present example, sixty solar cell modules installed are all of the same type.

Prior to the installation, a blue adhesive film was stuck to a light-receiving surface side of each of thirty solar cell modules, which were a half of the total modules, and a red adhesive film was stuck to each of the remaining half of the modules.

In the present example, the modules having the blue adhesive film thereon were installed in the first and third strings, and the solar cell modules having the red adhesive film thereon were installed in the second and fourth strings. On the occasion of the installation, identification of the strings was easy and the installation workability was very good, because of the color difference of the adhesive films attached to the module surfaces between the adjacent strings. After completion of the installation, all of the films were removed, and appearance of the solar cell modules was inspected. An anomaly such as a flaw was not recognized in the inspection.

The following effects are achieved by the production method and installation method of the solar cell modules according to the present invention.

(1) By placing the adhesive films on the solar cell modules in the production step of solar cell module, the surfaces of the solar cell modules can be protected from damage during the steps and the yield of production is increased.

(2) By sticking the adhesive films to the solar cell modules and then undergoing the formation working on the area without the adhesive film, the production steps are not affected thereby and the surfaces of the solar cell modules can be protected from damage.

(3) Since the adhesive films are stuck on the solar cell modules, the surfaces of the solar cell modules can be protected from damage which could occur during transportation thereof or during installation thereof.

(4) By peeling the adhesive films after installation of the solar cell modules, loss can be prevented in the output of modules due to absorption of light by the adhesive films.

(5) By changing the colors of the adhesive films stuck on the surfaces of the solar cell modules, identification of the solar cell modules becomes easier in the production steps, and the workability and productivity can be improved.

(6) By changing the colors of the adhesive films stuck on the surfaces of the solar cell modules for every type or every string of the modules, identification becomes easier of the types or strings of the solar cell modules during installation and confusion is minimized during the installation work. Therefore, the installation workability is enhanced and in turn, the installation cost becomes lower.

What is claimed is:

1. A method of producing a solar cell module, comprising a formation working step for transforming a shape of the solar cell module, wherein the formation working step of the solar cell module is carried out after an adhesive film which is peeled from the solar cell module during use of the solar cell module is stuck to at least a part of light-receiving surface side and/or a non-light-receiving surface side of the solar cell module.

2. The method of producing a solar cell module according to claim 1, wherein the adhesive film is stuck to an area except for an area undergoing the formation working.

3. The method of producing a solar cell module according to claim 1, wherein the adhesive film is stuck to the light-receiving surface side.

4. The method of producing a solar cell module according to claim 1, wherein the adhesive film is a transparent or translucent film.

5. The method of producing a solar cell module according to claim 1, further comprising a step of inspecting an electric output of the solar cell module under irradiation to light while the adhesive film is kept stuck thereon.

6. The method of producing a solar cell module according to claim 1, further comprising a recording step for recording management information, wherein color of the adhesive film corresponds to sheets for recording management information.

7. The method of producing a solar cell module according to claim 1, wherein the solar cell is bent by rollers.

8. The method of producing a solar cell module according to claim 1, wherein a solar cell device of the solar cell module is an amorphous silicon based solar cell device formed on a stainless steel substrate.

9. The method of producing a solar cell module according to claim 1, wherein the light-receiving surface side of the solar cell module is made of a transparent weatherproof resin and the solar cell module has a formable reinforcing plate on the non-light-receiving surface side.

10. The method of producing a solar cell module according to claim 1, wherein the formation working step is conducted by bending the solar cell module.

11. A method of producing a plurality of solar cell modules, comprising a formation working step for transforming a shape of the solar cell module, wherein the formation working step of each solar cell module is carried out after an adhesive film which is peeled from the solar cell module during use of the solar cell module is stuck to at least a part of a light-receiving surface side and/or a non-light-receiving surface side of each solar cell module.

12. A method of producing a plurality of solar cell modules according to claim 11, wherein the colors of the adhesive films correspond to sheets for recording management information for every production lot of solar cell modules.

13. The method of producing a plurality of solar cell modules according to claim 11, wherein among different production lots of the solar cell modules, colors of the adhesive films are different from each other.

* * * * *

UNITED STATES PATENT AND TRADEMARK OFFICE
CERTIFICATE OF CORRECTION

PATENT NO. : 6,093,581

DATED : July 25, 2000

INVENTOR(S): AKIHARU TAKABAYASHI

Page 1 of 2

It is certified that error appears in the above-identified patent and that said Letters Patent is hereby corrected as shown below:

COLUMN 1:
Line 16, "of" should be deleted.

COLUMN 3:
Line 6, "is" should read --are--;
Line 23, "of the both side" should read --of both sides--; and
Line 31, "as" should be deleted.

COLUMN 6:
Line 31, "totally" should read --total--.

COLUMN 10:
Line 26, "very alike" should read --very much alike--.

UNITED STATES PATENT AND TRADEMARK OFFICE
CERTIFICATE OF CORRECTION

PATENT NO. : 6,093,581

DATED : July 25, 2000

INVENTOR(S): AKIHARU TAKABAYASHI

It is certified that error appears in the above-identified patent and that said Letters Patent is hereby corrected as shown below:

COLUMN 12:
Line 18, "as it" should be deleted;
Line 29, "films" should read --adhesive films--; and
Line 53, "films" should read --adhesive films--.

Signed and Sealed this

Seventeenth Day of April, 2001

Attest:

NICHOLAS P. GODICI

Attesting Officer

Acting Director of the United States Patent and Trademark Office